United States Patent
Schneiders et al.

(10) Patent No.: US 12,276,918 B2
(45) Date of Patent: Apr. 15, 2025

(54) METHOD AND APPARATUS FOR CALCULATING A SPATIAL MAP ASSOCIATED WITH A COMPONENT

(71) Applicant: ASML Netherlands B.V., Veldhoven (NL)

(72) Inventors: Mauritius Gerardus Elisabeth Schneiders, Eindhoven (NL); Koos Van Berkel, Waalre (NL); Wenjie Jin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 173 days.

(21) Appl. No.: 18/016,226

(22) PCT Filed: Jun. 17, 2021

(86) PCT No.: PCT/EP2021/066369
§ 371 (c)(1),
(2) Date: Jan. 13, 2023

(87) PCT Pub. No.: WO2022/012844
PCT Pub. Date: Jan. 20, 2022

(65) Prior Publication Data
US 2023/0273527 A1    Aug. 31, 2023

(30) Foreign Application Priority Data
Jul. 17, 2020   (EP) .................................... 20186351

(51) Int. Cl.
*G03F 7/00*    (2006.01)
*G06F 17/12*   (2006.01)

(52) U.S. Cl.
CPC ...... *G03F 7/70266* (2013.01); *G03F 7/70504* (2023.05); *G03F 7/70508* (2013.01);
(Continued)

(58) Field of Classification Search
CPC .. G03F 7/70258; G03F 7/70266; G03F 7/705; G03F 7/70504; G03F 7/70508;
(Continued)

(56) References Cited

U.S. PATENT DOCUMENTS 7,462,430 B2 * 12/2008 Menchtchikov .... G03F 7/70783
430/311
9,466,538 B1   10/2016 Skordas et al.
(Continued)

FOREIGN PATENT DOCUMENTS

EP    1 548 504 A1   6/2005

OTHER PUBLICATIONS

Modeling and Optimization of Lens Heating Effect for Lithographic Projector—Journal of Micro/Nanolithography, MEMS and MOEMS (Apr.-Jun. 2018)—Mao et al.*

(Continued)

*Primary Examiner* — Deoram Persaud
(74) *Attorney, Agent, or Firm* — Sterne, Kessler, Goldstein & Fox P.L.L.C.

(57) ABSTRACT

A method for calculating a spatial map associated with a component, the spatial map indicating spatial variations of thermal expansion parameters in the component, the method comprising: providing or determining a temperature distribution in the component as a function of time; calculating the spatial map associated with the component using the provided or determined temperature distribution in the component and optical measurements of a radiation beam that has interacted directly or indirectly with the component, the optical measurements being time synchronized with the provided or determined temperature distribution in the component.

13 Claims, 3 Drawing Sheets

(52) U.S. Cl.
CPC ........ *G03F 7/706* (2013.01); *G03F 7/706839* (2023.05); *G03F 7/70891* (2013.01); *G06F 17/12* (2013.01)

(58) Field of Classification Search
CPC ............... G03F 7/706; G03F 7/706839; G03F 7/70883; G03F 7/70891; G06F 17/12; G01K 1/026; G01M 11/0242; A01G 2009/003; A01G 9/021
See application file for complete search history.

(56) References Cited

U.S. PATENT DOCUMENTS

| | | | |
|---|---|---|---|
| 2005/0136346 A1* | 6/2005 | Ottens | G03F 7/70875 430/30 |
| 2013/0188162 A1 | 7/2013 | Gerhard et al. | |
| 2018/0281286 A1* | 10/2018 | Vilajosana | B29C 64/393 |
| 2019/0369480 A1* | 12/2019 | Hansen | G03F 1/36 |
| 2024/0077380 A1* | 3/2024 | Van De Wal | G03F 7/706 |

OTHER PUBLICATIONS

International Search Report and Written Opinion of the International Searching Authority directed to International Patent Application No. PCT/EP2021/066369, mailed Oct. 25, 2021; 12 pages.

\* cited by examiner

METHOD AND APPARATUS FOR CALCULATING A SPATIAL MAP ASSOCIATED WITH A COMPONENT

CROSS-REFERENCE TO RELATED APPLICATIONS

This application claims priority of EP application 20186351.1 which was filed on 17 Jul. 2020, and which is incorporated herein in its entirety by reference

FIELD

The present invention relates to a method and apparatus for calculating a spatial map associated with a component, e.g. a component in a lithographic apparatus. More particularly, the method relates to modelling component heating that result in thermally induced aberrations or alignment errors, e.g. in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The projection system which is used to image the pattern from a patterning device onto the substrate will induce some aberrations in the wavefront of the projected image.

During the projection of the pattern onto the substrate, the projection system will heat up, and this will cause the imaging properties of the projection system to drift. In EUV lithography, this phenomenon is called mirror heating.

Although mirrors in the projection system are optimized for EUV radiation transmission, a significant part of EUV (but also out-of-band) energy is absorbed in the mirrors and transformed into heat. This heating causes thermal stresses in the material of the mirrors leading to deformations of the optical surfaces. These deformations finally cause aberrations in the projection system causing imaging errors. In addition, the heating, either directly or indirectly, may cause thermal stresses in the material of other components, such as lenses, substrate clamps, patterning devices (i.e. reticles or masks) or patterning device clamps.

It is an object of the invention to provide a method for calculating a spatial map associated with a component, e.g. a component such as a mirror in a lithographic apparatus. The spatial map is for use in predicting and modelling aberrations and/or alignment errors which obviates or mitigates one or more problems associated with the prior art.

SUMMARY

According to a first aspect of the invention, there is provided a method for calculating a spatial map associated with a component, the spatial map indicating spatial variations of thermal expansion parameters in the component, the method comprising: providing or determining a temperature distribution in the component as a function of time; calculating the spatial map associated with the component using the provided or determined temperature distribution in the component and optical measurements of a radiation beam that has interacted indirectly or directly with the component, the optical measurements being time synchronized with the provided or determined temperature distribution in the component.

This may have an advantage of improving the accuracy of a heating model of the component. The match in optical performance of a real system including the component with a heating model may be improved. The match between modelled and measured data may be relatively good. The calculation of the spatial map may be considered to be calibration of the spatial map.

The component may be a component of a lithographic apparatus.

The method may further comprise mathematically optimizing the spatial variations of the thermal expansion parameters indicated in the spatial map.

The mathematically optimizing may comprise linear optimizing.

The mathematical optimizing may comprise weighted optimizing or constrained optimizing.

The weighted optimizing may comprise least-square optimizing or regularized optimizing, and the constrained optimizing may comprise use of a linear program or a quadratic program.

The mathematically optimizing may comprise use of at least one of the coefficients of a thermal expansion relation, such as polynomial coefficients or other basis function coefficients.

The spatial map may be a zero-crossing temperature spatial map, the zero-crossing temperature spatial map may indicate spatial variations of zero-crossing temperatures in the component.

The optical measurements may be wavefront aberration measurements and/or alignment measurements.

The method may further comprise simulating wavefront aberrations and equating the simulated wavefront aberrations to the wavefront aberration measurements.

The method may further comprise recalculating the spatial map during operation of a lithographic apparatus.

The method may further comprise monitoring drift over time in the spatial map during operation of a lithographic apparatus.

The method may further comprise predicting thermally induced aberrations and/or alignment errors associated with the component using the calculated spatial map.

The method may further comprise calculating the thermally induced aberrations and/or alignment errors associated with the component in a lithographic apparatus using the calculated spatial map calculated based on measurements done on the same lithographic apparatus.

The method may further comprise correcting for the predicted thermally induced aberrations and/or alignment errors.

The correcting for the predicted thermally induced aberrations and/or alignment errors may include at least one of, moving at least one optical element or lens, radiation source and source mask optimization, and controlling a heater, a cooler, or a deformable manipulator.

The determining the temperature distribution in the component may comprise measuring the temperature distribution in the component or calculating the temperature distribution in the component using a thermal model.

The method may further comprise calibrating the thermal model of the component using thermal measurements of the component.

The temperature distribution in the component may comprise the full 3D thermal state of the component.

The spatial map may be a 2D or 3D spatial map.

The component may comprise at least one of an optical element, a mirror, a projection system mirror, an illumination system mirror, a lens, a projection system lens, an illumination system lens, a patterning device, a patterning device clamp, a substrate clamp, and a substrate table.

The method may further comprise calculating spatial maps associated with a plurality of components.

According to a second aspect of the invention, there is provided a lithographic apparatus arranged to project a pattern from a patterning device onto a substrate, wherein the lithographic apparatus is configured to calculate a spatial map associated with a component in the lithographic apparatus, the spatial map indicating spatial variations of thermal expansion parameters in the component, by: providing or determining a temperature distribution in the component as a function of time; using the provided or determined temperature distribution in the component and optical measurements of a radiation beam that has interacted indirectly or directly with the component to calculate the spatial map of the component, the optical measurements being time synchronized with the provided or determined temperature distribution in the component.

The lithographic apparatus may be configured to predict and/or correct for thermally induced aberrations and/or alignment errors associated with the component in the lithographic apparatus.

According to a third aspect of the invention, there is provided a computer program comprising computer readable instructions configured to cause a processor to carry out a method as described above.

According to a fourth aspect of the invention, there is provided a computer readable medium carrying a computer program as described above.

According to a fifth aspect of the invention, there is provided a computer apparatus comprising: a memory storing processor readable instructions; and a processor arranged to read and execute instructions stored in said memory; wherein said processor readable instructions comprise instructions arranged to control the computer to carry out a method as described above.

BRIEF DESCRIPTION OF THE DRAWINGS

Embodiments of the invention will now be described, by way of example only, with reference to the accompanying schematic drawings, in which.

DETAILED DESCRIPTION

Figure 1:
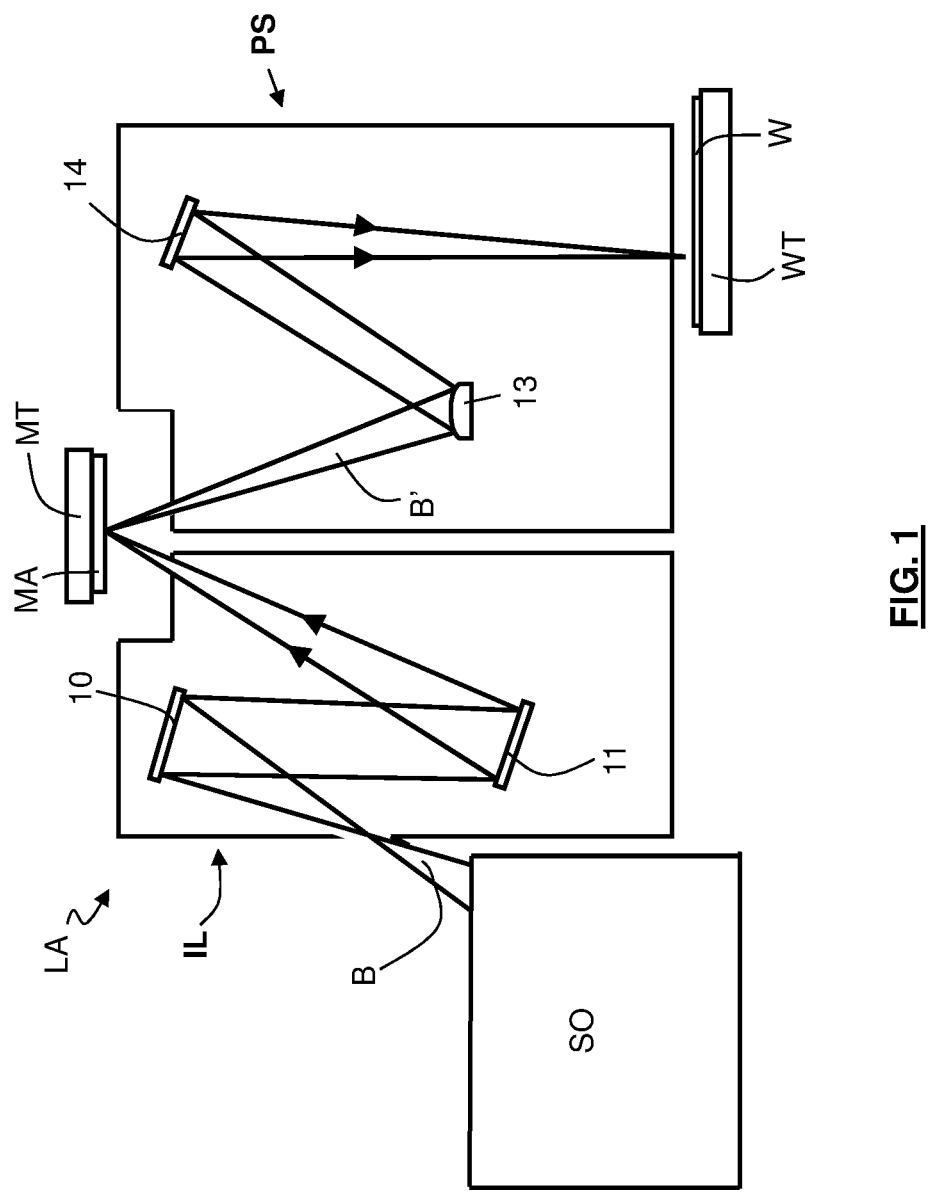
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Optical surface deformation may occur in mirrors in the projection system PS of the EUV lithographic apparatus LA. More generally, surface deformation may occur in components in the EUV lithographic apparatus LA. It will be appreciated that, although the following description generally relates to a mirror or mirrors in the projection system PS in the EUV lithographic apparatus LA, the methods described are also applicable to other components in the EUV lithographic apparatus LA and other components in other lithographic apparatus, such as a DUV lithographic apparatus. For example, the component may be an optical element, a mirror, a projection system mirror, an illumination system mirror, a lens, a projection system lens, an illumination system lens, a patterning device, a patterning device clamp, a substrate clamp, and a substrate table.

To reduce the deformations causing aberrations in the projection system PS, the mirror material may be optimized for minimum deformations using ultra-low expansion (ULE) material. This material exhibits a quadratic expansion relation with temperature, which has almost-zero expansion properties around its design temperature, known as the zero-crossing temperature (Tzc or ZCT). The mirror top side (the side which the radiation beam B' is incident upon) should be kept as close to this Tzc as possible to minimize deformations. Due to more aggressive heat loads (higher power, more extreme illumination profiles) it is not possible to keep the full mirror surface around this sweet spot. The mirror material may be made of other materials that have a relatively low or very low, coefficient of thermal expansion (CTE), e.g. ZERODUR or Cordierite.

Optical surface deformation is very sensitive to the local (typically non-uniform) irradiance (heat load) and the (local) zero-crossing Temperature (Tzc). Uniform irradiance provides a uniform temperature across the surface of the material which results in a well-correctable bending of the optical surface—i.e. strain in material. On the other hand, non-uniform irradiance provides isolated areas of relatively increased temperature which results in a mainly non-correctable deformation of optical surface—i.e. strain in material.

Non-linear thermal expansion curves may be shown for zero-crossing temperatures Tzc (ZCT). For each curve, there may be a trough at the Tzc and, thus, the curve may be relatively gradual around the Tzc. This means that, at, or near, the Tzc there is relatively little thermal expansion.

Deformation may be larger for an example Tzc than for another example Tzc. Thus, the deformation is very sensitive to the particular Tzc.

Manufacturing tolerance has a large impact on spatial variation of Tzc. In order to obtain a low "slope" (quadratic term in curve), the production process for ULE materials needs to be kept stable over a long period (weeks). This may result in a manufacturing tolerance on the average Tzc.

Spatial variations of Tzc may be measured, e.g. measured on a reticle (patterning device MA). There may be a change in temperature in ° C. (or in Kelvin). There may be spatial variations of typically several Kelvins in the reticle. In some projection systems PS of some lithographic apparatus LA, some mirrors may have a particular variation whereas other mirrors may have a different variation. The spatial variations of Tzc may be calculated by measuring the material's coefficient of linear thermal expansion (CTE), e.g. by using ultrasound.

The impact of this non-uniform Tzc on the performance of the projection system PS is large. This may be shown by comparing optical key performance indicators for uniform Tzc and non-uniform Tzc. In the past, efforts to match optical performance of a real projection system PS with mirror heating models have not provided relatively good results.

Figure 2:
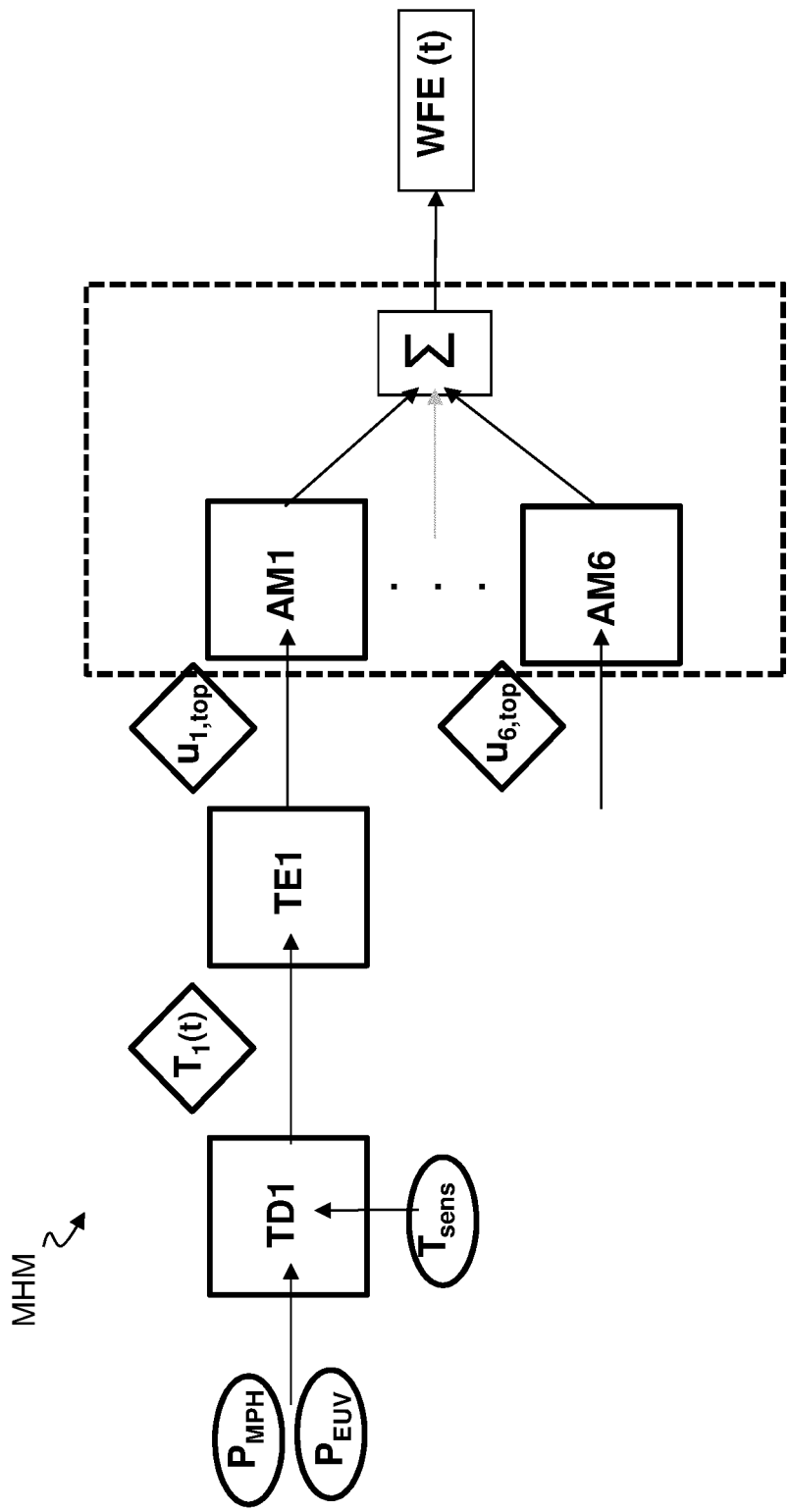
FIG. 2 depicts a schematic diagram of a projection system mirror heating model including the calculation of a spatial map according to an embodiment of the invention.

FIG. 2 depicts a schematic diagram of a mirror heating model (MHM) for the projection system PS of the EUV lithographic apparatus LA. More particularly, the impact of thermal effects on the wavefront error (WFE) is sequentially build up from three sub-models. These three models are, respectively, a thermo-dynamic sub-model (TD1), a thermo-elastic mapping sub-model (TE1), and a mapping towards aberrations sub-model (AM1). The thermo-elastic mapping sub model (TE1) includes the spatial map (Tzc). The mapping towards aberrations sub-model (AM1) may include ray tracing.

The projection system PS may have six mirrors (M1-M6). Thus, the mirror heating model MHM has sub-models for each mirror M1-M6, i.e. TD1-TD6, TE1-TE6 and AM1-AM6. For clarity, FIG. 2 only shows the sub-models TD1, TE1, AM1 and AM6, but it will be understood that there are corresponding sub-models for all the mirrors M1-M6. Reference will be made to sub-models TD1, TE1 and AM1 for mirror M1, but, it will be appreciated that, features described will be equally applicable to the sub-models of the other mirrors M2-M6. It will be appreciated that, in other embodiments, there may be more or less than 6 mirrors (or more generally components) and, thus, more or less than the corresponding number of sub-models. In some embodiments, there may be a single component used in the mirror heating model (MHM).

As will be described, a Tzc spatial map from the (white-box) sub-model TE1 is calculated (or more particularly calibrated) on the basis of optical measurements (wavefront aberration measurements) and thermal measurements (e.g. mirror temperatures, preheating powers and EUV radiation beam powers). The Tzc spatial map indicates spatial variations of zero-crossing temperatures in the component. In other embodiments, the spatial map may be more generally considered to be a spatial map indicating spatial variations of thermal expansion parameters in the component, rather specially being zero-crossing temperatures. In other embodiments, the optical measurements may be e.g. alignment measurements. In embodiments, the mirror heating model (MHM) may be used to predict thermally induced alignment errors in a similar way to predicting thermally induced aberrations. The alignment may be both in-plane or out-of-plane.

The identification of the zero crossing temperatures (Tzc) is carried out in a sequential fashion. The thermo-mechanical properties may be calculated (calibrated) per mirror using temperature sensor tracing and laser powers from a mirror preheating system. The mirror preheating system aims to keep the thermal load on the mirrors constant and thus the temperatures constant. This may be when the EUV radiation beam is not incident on the mirrors or when the EUV radiation is on the mirrors as the EUV radiation may not be uniformly distributed on the mirrors (due to the illumination modes). The mirror preheating system may comprise an IR radiation beam. Thermal measurements of the mirror M1 may be used in the calibration of the thermal model TD1. The thermal measurements may be from thermal sensors. The thermal measurements may comprise heat absorption, conduction, convection, or radiation.

The thermal model may comprise a first-principle model, a finite element model, or an empirical model. In step 1, temperature T of the component is optimized.

Inputs into the sub-model TD1 include power of the mirror pre heating system ($P_{MPH}$), power of the EUV radiation beam ($P_{EUV}$) and temperatures of sensors ($T_{sens}$). Thus, for thermo-dynamic identification (single mirror), $T_1(t)$ (or more generally $T_i(t)$) is found using $P_{MPH}$, $P_{EUV}$ and $T_{sens}$. The sensors may be located on or below the surface of the mirror M1. These inputs are specific for the application for the projection system PS, but it will be appreciated that, for other components, different inputs may be used for the thermal sub-model TD1.

Thermal identification results may be shown in graphs. The graphs may show data used to calibrate the thermal sub-models TD1-TD6. Measurable quantities from the real system (laser powers and sensor temperatures) in the sub-models TD1-TD6 are matched with measurement data.

The graphs may show mirror preheating (MPH) power [W] over time [s] and/or may show the temperature measured by the temperature sensor [° C.] over time [s].

For some of the time, the EUV radiation beam may be off (i.e. in a 'cold state'). After some time, the EUV radiation beam may be on, (i.e. in a 'hot state').

Once the sub-model TD1 is calibrated or nominal results are accurate enough, the full state thermal footprint of each mirror as function of time T(t) may be determined, e.g. in a transient simulation. The thermal footprint may be the 3D thermal state, i.e. the temperature at each location in the mirror at a given time instant. In other words, it is the 3D temperature distribution within the mirror or mirrors as a function of time. More generally, a temperature distribution in the mirror (component) is calculated as a function of time using the sub model TD1. For mirror 1 (M1), the full state thermal footprint is $T_1(t)$.

The thermal states simulated in the sub-model TD1, together with the measured wavefront errors at the same timestamps, are used as inputs for the Tzc identification. That is, the full state thermal footprint $T_1(t)$ and the measured wavefront errors from the wavefront measurements at the same time are input into the sub-model TE1. Wavefront measurements may be measured by an optical measurement apparatus. That is, wavefront aberrations are measured (wavefront itself is not measured).

An expression for the thermal expansion sub-model TE1 may be $L(T_1(t), T_{zc,i}(p))$, where L indicates a non-linear function, $T_1(t)$ is the thermal footprint of mirror M1 as a function of time and $T_{zc,i}(p)$ is the thermal-elastic mapping.

A thermo-elastic relation may be expressed as: $K_T\varepsilon_T + Kx_U - f = 0$, with no external forces. Where $\varepsilon_T$ is thermal strain, K is the mechanical stiffness matric, $x_U$ is the mechanical state vector (representing deformations).

For linear expansion: Thermal strain $\varepsilon_T = \alpha T$, where $\alpha$ is the expansion coefficient of the material and T is the full temperature state of the mirror.

For ULE materials, non-linear expansion: $\varepsilon_T = \alpha(T)T = \frac{1}{2}\alpha_i(T + 2(T_{amb} - T_{sc}))\cdot T$, where $T_{amb}$ is the ambient temperature and $T_{zc}$ is the zero crossing temperature.

Mechanical deformation may be expressed using the following equations:

Rearranging $K_T\varepsilon_T + Kx_U = 0$, gives $x_U = -K^{-1}K_T\varepsilon_T$.

$u_{top} = Px_U = -PK^{-1}K_T\varepsilon_T$, where $u_{top}$ is the top surface deformation of the mirror and P is a selection matrix.

Then, substituting for $\varepsilon_T$ gives $u_{top} = -PK^{-1}K_T\frac{1}{2}\alpha_i(T + 2(T_{amb} - T_{zc}))\cdot T$, where $\{-PK^{-1}K_T\frac{1}{2}\alpha_i(T + 2(T_{amb} - T_{zc}))\cdot T\}$ may be expressed as non-linear function $L(T_1(t), T_{zc,i}(p))$.

Expanding out gives: $u_{top} = -PK^{-1}K_T\alpha_i(\frac{1}{2}T\cdot T + T_{amb}T) + PK^{-1}K_T\alpha_iT\cdot T_{zc}$. Thus, it is linear in Tzc.

The output from the sub-model TE1 is an indication of the deformation of the top surface of the mirror ($u_{1,top}$). The top surface being the surface which the EUV radiation beam is reflected from. The output ($u_{1,top} - u_{6,top}$) from each of the sub-models TE1-TE6 for each mirror M1-M6 are input into the sub-models AM1-AM6.

The sub-models AM1-AM6 simulate radiation beam ray tracing and the results for each of the mirrors M1-M6 are combined (summed) to provide a wavefront error over time (WFE(t)) for all the mirrors M1-M6. That is, wavefronts are simulated and wavefront errors WFE(t) are taken from the simulated wavefronts aberrations. It will be appreciated that, in other embodiments, a wavefront error WFE(t) may be calculated for more or less than 6 mirrors. For example, the wavefront error WFE(t) (or more generally optical measurement error) may be calculated in a heating model for a single mirror (or more generally, a single component).

Wavefront error (WFE) indicates deformation/temperature per mirror i (e.g. M1-6). Wavefront error (WFE) may be expressed as: $WFE(t) = \Sigma_{i}^{mirrors} M_i u_{i,top} = \Sigma_{i}^{mirrors} M_i L_i(T_i(t), T_{i,zc}(p))\cdot T_i(t)$, where $M_i$ is the mirrors (e.g. M1-M6), $T_i$ is the temperature field, and a summation is taken over all the mirrors $M_i$.

As the full thermal states of all mirrors are known (calculated in step 1), subsystems in the model can be rewritten and the wavefront error (WFE) can be expressed as a linear function of the zero-crossing temperature, which can be spatially distributed.

By putting this simulated WFE equal to the measured aberrations, an identification problem is set up: $WFE = A(T)Tzc + b_0(T)$.

Rearranging gives: $A(T)Tzc = WFE - b_0(T)$. This is a least-squares problem and, thus, Tzc can be optimized with least-squares like techniques. This can be done for a spatially distributed 2D or 3D Tzc map for each mirror M1-M6. A 3D spatial Tzc map is more realistic and, hence, more accurate.

The Tzc spatial map is used as a set of optimization variables in a mathematical optimization. That is, spatial variations of zero-crossing temperatures are used as optimization variables in a mathematical optimization. The method comprises mathematically optimizing the spatial variations of the zero-crossing temperatures indicated in the spatial map. In this case, the optimization variables are linear optimization variables. That is, the mathematically optimizing comprises linear optimizing. The mathematical optimization is a weighted optimization, more particularly, a least square optimization. The mathematically optimizing comprises weighted optimizing (or, in other examples, constrained optimizing).

The spatial map is calculated (calibrated) using the calculated thermal footprint of the mirrors M1-M6 which was calculated in the sub-model TD1 and the wavefront measurements of the EUV radiation beam B' which has interacted with the mirrors M1-M6. The optical measurements are time synchronized with the calculated thermal footprint of the mirrors M1-M6. It will be appreciated that six mirrors (M1-M6) is just an example, and other numbers of mirrors may be used, e.g. eight mirrors (M1-M8).

In embodiments, the EUV radiation beam may also be the main cause for patterning device clamp, substrate clamp and substrate table indirect heating (and deformation). For example, the EUV radiation beam may be incident on the patterning device MA and due to the patterning device heating up (directly), the patterning device clamp may also heat up (indirectly). In embodiments, more generically, the wavefront measurements may be taken with respect to any radiation beam which has interacted with the mirrors M1-M6. Measurements may be taken of the radiation beam that has heated the mirrors and caused the deformation (i.e. the radiation beam that has been reflected from the mirror after heating), or measurements may be taken of a separate radiation beam that has not caused the deformation (or at least is not the primary case of the deformation). For example, the radiation beam that has interacted with the component, and has been measured for being input into the MHM, may be only for measuring the surface deformation of the mirrors (components). The heating of the mirrors may be done in any way, e.g. any controlled way. Either the same radiation beam that is measured or another separate beam like IR, or any other mechanism may be used to temperature control the mirrors. The temperature control may include heating or cooling, e.g. for cooling, water channels may be used in the substrate of the component.

Once the spatial map is calculated, then the sub-model TE1 may be used, in combination with the sub-model TD1 and sub-model AM1, to provide the simulated wavefronts without requiring actual wavefront measurements to be measured by an optical measurement apparatus.

It will be appreciated that, although least squares optimization is described here, other mathematical optimization techniques may be used to determine the Tzc and, thus, the Tzc spatial map.

For example, for a general polynomial case $\varepsilon_T = \alpha(T)T = (c_n T^n + c^{n-1}T^{n-1} + \ldots + c_1 T + c_0) \cdot T$, where $T^n = T \ldots T$. For a ULE material, finding Tzc: n=1, $c_1$ is fixed, $c_0$ represents Tzc. T is the temperature of the mirrors (as a function of time and location), and $c_n$ are the coefficients of the regression polynomials which fits the thermal expansion behaviour of the material.

Thus, the mathematical optimization may comprise at least one of the coefficients of a thermal expansion relation, such as polynomial coefficients or other basis function coefficients.

As examples, the mathematical optimization may comprise a weighted optimization or a constrained optimization. The weighted optimization may comprise a regularized optimization. The constrained optimization may comprise a linear program or a quadratic program.

The optical performance of the mirror heating model MHM including the Tzc spatial maps may be matched with measured data from wavefront measurements.

Wavefront errors WFE (nm) over time (t) may be shown for different Zernikes, i.e. $Z_5$ to $Z_{25}$. Thermally induced aberrations may, for example, be expressed as a set of Zernikes. For example, Zernike coefficients $Z_5$ to $Z_{25}$ may be used to express the aberrations. In other examples, other ranges of Zernike coefficients may be used. For example Zernike coefficients from $Z_5$, up to $Z_{64}$, up to $Z_{77}$, or up to $Z_{100}$ may be used.

Measurements may be taken at three different places in an optical measurement apparatus.

It can be shown that the optical performance prediction with segmented Tzc maps provides a relatively good match with measured optical performance data, especially for (the relevant) Zernike levels above 0.05 nm. That is, the modelled data corresponds relatively well with the measured data. Thus, a good match between model and measurement is found by allowing for a spatial variation in the Tzc map.

Residual mismatch may be caused by thermal mismatch, which can be improved by further calibration of the thermal model TD1.

It has been realised that including (spatial) non-uniform Tzc maps based on realistic distributions, shows a modelled performance range which can also be found back in measurements of various projection systems PS. Hence, including a correct Tzc map in the model provides more accurate results.

Calculated Tzc spatial maps for mirrors M1-M6 as characterised by the optimization may be created. The Tzc spatial maps may show the spatial variation of the zero-crossing temperatures (Tzc) on the mirror surface, with the scale being in temperature (Kelvin).

The identified Tzc maps appear relatively smooth and spatial distribution is tuned towards the expected variation, using weights in the regularization which is used in the optimization. Without Tzc variations, the match between modelled and measured data is relatively poor.

The Tzc spatial maps may be calculated for the mirror M1-M6 before the mirrors M1-M6 are used for EUV radiation exposure in the lithographic apparatus LA, i.e. there may be an initial calculation (calibration). In addition, the spatial maps may be recalculated (recalibrated) during operation of the lithographic apparatus LA. The sensor data may be stored during operation of the lithographic apparatus LA. Thus, additional downtime of the lithographic apparatus LA to do any calculation (calibration) is not required as it can be done when the lithographic apparatus LA is operating. Calibration may be refined further without further calibration time.

Furthermore, the lithographic apparatus LA may be used in a different way from as was envisaged when the initial calibration was carried out. Thus, further calibration may be required. For example, calibration may be carried out once a year. Any drift in the spatial map over time in the spatial map during operation of the lithographic apparatus LA may be monitored and this can then be taken into account in the mirror heating model MHM if required. The Tzc of the material may change over time, e.g. due to relaxation effects of the material or the structure may change over time, e.g. after electron gun compaction.

The calculated Tzc spatial maps may be used to provide the simulated wavefront aberrations without requiring wavefront measurements. That is, the thermally induced aberrations associated with the mirrors M1-M6 in the projection system PS may be predicted using the calculated Tzc spatial maps. Advantageously, the thermally induced aberrations associated with the mirrors M1-M6 in the projection system PS in the lithographic apparatus LA may be calculated using the calculated spatial map which was calculated (calibrated) on the same lithographic apparatus LA. This means that the same lithographic apparatus LA may be used for the calculation (calibration) as is being used in operation. This has the advantage that the model results should provide more accurate predictions.

As the spatial Tzc for the mirrors (i.e. components) may be unknown, the present invention provides spatial Tzc maps to be used in the mirror heating model MHM. The mirror heating model MHM needs projection system PS specific calibration, due to the dominant impact of the manufacturing tolerance. This is provided in the present invention by calibrating the MHM on the lithographic apparatus LA. The calibration of the Tzc spatial maps in the present invention means that the manufacturing tolerances and projection system PS specific realizations do not need to be known. Furthermore, changes in the spatial Tzc over time may be compensated for with the present invention, which may not have been possible if the initial indication of the spatial Tzc was being relied upon.

Spatial Tzc is required for several Mirror Heating solutions. To reach performance in future systems, prediction models are foreseen in feedforward and feedback mirror heating solutions. The quality of these models is important for the performance of the solutions.

The predicted thermally induced aberrations may be corrected in the lithographic apparatus LA. Depending on the type of component, this may be by, e.g. moving at least one optical element or lens, source mask optimization, and controlling a heater, a cooler, or a deformable manipulator. Source mask optimization relates to changing illumination patterns and placing assist features in the mask to enhance lithographic performance. The heater(s) may comprise infrared heater(s) or wire(s). The cooler(s) may comprise water or gas. The deformable manipulator(s) may comprise a piezoelectric actuator in an optical element, a patterning device clamp, a substrate clamp, or a substrate table.

Figure 3:
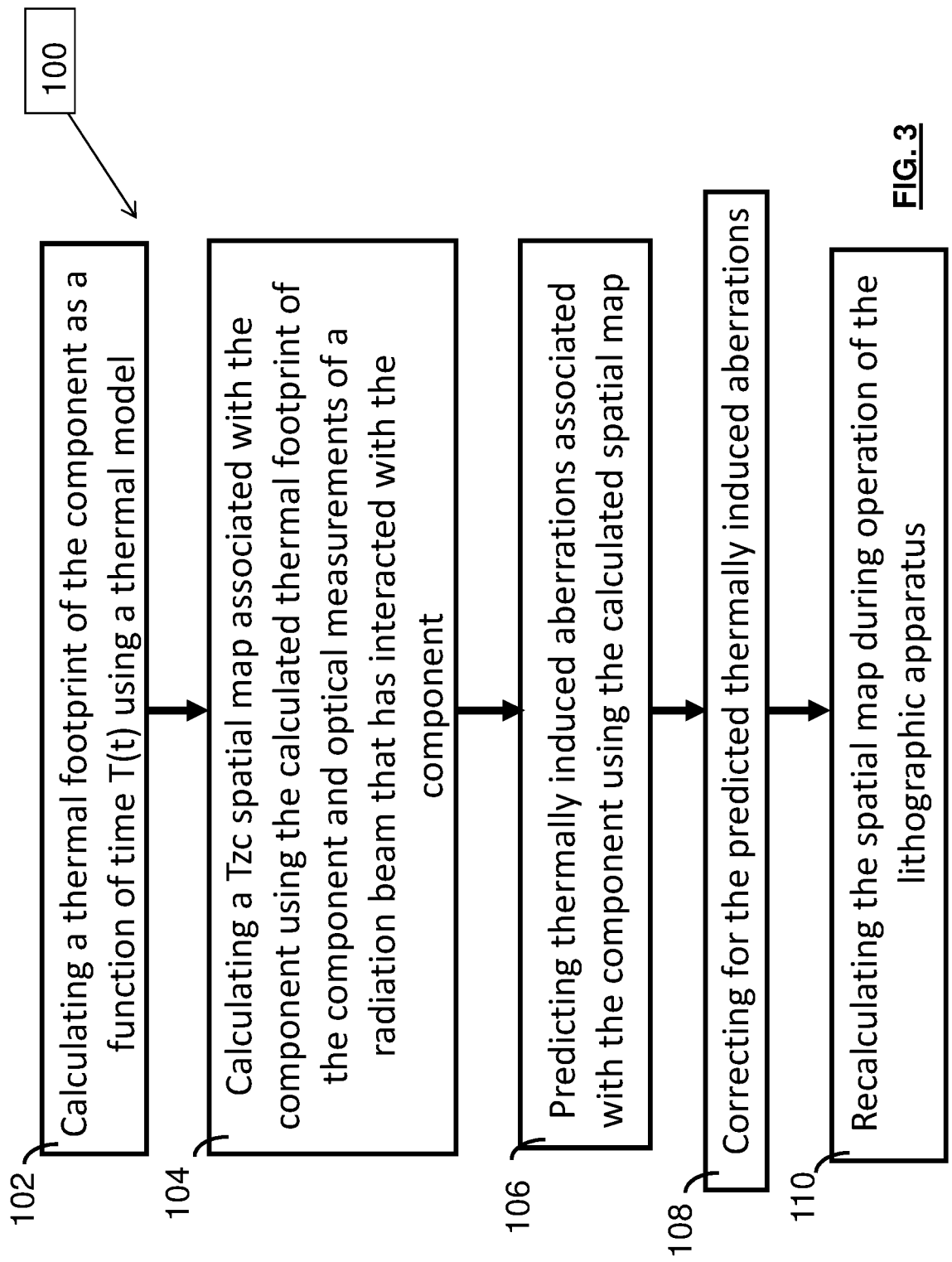
FIG. 3 depicts a flow diagram of calculating and using a zero-crossing temperature spatial map according to an embodiment of the invention.

FIG. 3 depicts a flow diagram 100 of calculating a Tzc spatial map for a component or components (e.g. mirrors M1-M6 of a projection system PS), and using a Tzc spatial map. That is, predicting, and correcting for, thermally induced aberrations associated with a component or the components on a lithographic apparatus LA.

In step 102, a thermal footprint of the component as a function of time T(t) is calculated using a thermal model.

In step 104, a Tzc spatial map associated with the component is calculated using the calculated thermal footprint of the component and optical measurements of a radiation beam that has interacted directly or indirectly with the component. The optical measurements are time synchronized with the calculated thermal footprint. The optical measurements may be wavefront aberration measurements. The method may include simulating wavefronts and equating them to the wavefront aberration measurements. The spatial map may be used as optimization variables in a mathematical optimization. The method may comprise mathematically optimizing the spatial variations of zero-crossing temperatures indicated in the spatial map.

In step 106, thermally induced aberrations associated with the component are predicted using the calculated spatial map.

In step 108, the predicted thermally induced aberrations associated with the component are corrected. This correction may include at least one of, moving at least one optical element or lens, radiation source and patterning device optimization (source mask optimization), and controlling a heater, a cooler, or a deformable manipulator.

In step 110, the spatial map is, optionally, recalculated during operation of the lithographic apparatus LA.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for calculating a spatial map associated with a component, the spatial map indicating spatial variations of thermal expansion parameters in the component, the method comprising:
   providing or determining a temperature distribution in the component as a function of time; and
   calculating the spatial map associated with the component using the provided or determined temperature distribution in the component and optical measurements of a radiation beam that has interacted directly or indirectly with the component, wherein the optical measurements are time synchronized with the provided or determined temperature distribution in the component.

2. The method of claim 1, further comprising mathematically optimizing the spatial variations of the thermal expansion parameters indicated in the spatial map.

3. The method of claim 2, wherein the mathematically optimizing comprises linear optimizing.

4. The method of claim 2, wherein the mathematically optimizing comprises weighted optimizing or constrained optimizing.

5. The method of claim 4, wherein:
   the weighted optimizing comprises least-square optimizing or regularized optimizing, and
   the constrained optimizing comprises use of a linear program or a quadratic program.

6. The method of claim 2, wherein the mathematically optimizing comprises use of at least one coefficient of a thermal expansion relation.

7. The method of claim 1, wherein the spatial map is a zero-crossing temperature spatial map configured to indicate spatial variations of zero-crossing temperatures in the component.

8. The method of claim 1, wherein the optical measurements are wavefront aberration measurements and/or alignment measurements.

9. The method of claim 1, further comprising:
   simulating wavefront aberrations, and
   equating the simulated wavefront aberrations to the wavefront aberration measurements.

10. The method of claim 1, further comprising recalculating the spatial map during operation of a lithographic apparatus.

11. A lithographic apparatus, comprising:
   a patterning device arranged to project a pattern onto a substrate,
   a processor configured to calculate a spatial map associated with a component in the lithographic apparatus, the spatial map indicating spatial variations of thermal expansion parameters in the component, by:
      providing or determining a temperature distribution in the component as a function of time; and using the provided or determined temperature distribution in the component and optical measurements of a radiation beam that has interacted directly or indirectly with the component to calculate the spatial map of the component, wherein the optical measurements are time synchronized with the provided or determined temperature distribution in the component.

12. The lithographic apparatus of claim 11, wherein the processor is further configured to predict and/or correct for thermally induced aberrations and/or alignment errors associated with the component in the lithographic apparatus.

13. A computer readable medium carrying a computer program comprising computer readable instructions configured to cause a processor to carry out operations for calculating a spatial map associated with a component, the spatial map indicating spatial variations of thermal expansion parameters in the component, the operations comprising:
provided or determining a temperature distribution in the component as a function of time; and
calculating the spatial map associated with the component using the provided or determined temperature distribution in the component and optical measurements of a radiation beam that has interacted directly or indirectly with the component, wherein the optical measurements are time synchronized with the provided or determined temperature distribution in the component.

* * * * *

UNITED STATES PATENT AND TRADEMARK OFFICE
CERTIFICATE OF CORRECTION

| | | |
|---|---|---|
| PATENT NO. | : 12,276,918 B2 | Page 1 of 1 |
| APPLICATION NO. | : 18/016226 | |
| DATED | : April 15, 2025 | |
| INVENTOR(S) | : Schneiders et al. | |

It is certified that error appears in the above-identified patent and that said Letters Patent is hereby corrected as shown below:

In the Specification

In Column 7, Line 33, delete "(T+2(Tamb-TSC)).T," and replace with --(T+2(Tamb-TZC)).T,--.

Signed and Sealed this
Twenty-seventh Day of May, 2025

Coke Morgan Stewart
*Acting Director of the United States Patent and Trademark Office*